(12) United States Patent
Liu et al.

(10) Patent No.: US 10,504,922 B2
(45) Date of Patent: Dec. 10, 2019

(54) ARRAY SUBSTRATE, DISPLAY PANEL AND DISPLAY DEVICE CAPABLE OF SYNCHRONIZING IMAGE DISPLAY AND FINGERPRINT IDENTIFICATION

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yingming Liu, Beijing (CN); Xue Dong, Beijing (CN); Haisheng Wang, Beijing (CN); Xiaochuan Chen, Beijing (CN); Xiaoliang Ding, Beijing (CN); Shengji Yang, Beijing (CN); Weijie Zhao, Beijing (CN); Changfeng Li, Beijing (CN); Lei Wang, Beijing (CN); Pengpeng Wang, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 162 days.

(21) Appl. No.: 15/562,874

(22) PCT Filed: Feb. 17, 2017

(86) PCT No.: PCT/CN2017/073912
§ 371 (c)(1),
(2) Date: Sep. 28, 2017

(87) PCT Pub. No.: WO2017/202075
PCT Pub. Date: Nov. 30, 2017

(65) Prior Publication Data
US 2018/0188583 A1   Jul. 5, 2018

(30) Foreign Application Priority Data

May 24, 2016   (CN) .......................... 2016 1 0349471

(51) Int. Cl.
*H01L 27/12*       (2006.01)
*G02F 1/1333*      (2006.01)
(Continued)

(52) U.S. Cl.
CPC ........ *H01L 27/1214* (2013.01); *G02F 1/1368* (2013.01); *G02F 1/13338* (2013.01); *G02F 1/136227* (2013.01); *G06K 9/0004* (2013.01)

(58) Field of Classification Search
CPC ....... H01L 27/14607–14614; H01L 27/14678; H01L 27/146–14893; H01L 27/1214;
(Continued)

(56) References Cited

U.S. PATENT DOCUMENTS 9,142,704 B2    9/2015  Jung et al.
2003/0183019 A1* 10/2003 Chae .................... G06K 9/0004
                                                    73/862.624
(Continued)

FOREIGN PATENT DOCUMENTS

CN    102314248 A    1/2012
CN    103760703 A    4/2014
(Continued)

OTHER PUBLICATIONS

Office Action received for Chinese Patent Application No. 201610349471.2, dated Jul. 2, 2018, 24 pages (13 pages of English Translation and 11 pages of Office Action).
(Continued)

*Primary Examiner* — Scott B Geyer
(74) *Attorney, Agent, or Firm* — Womble Bond Dickinson (US) LLP

(57) ABSTRACT

This disclosure provides an array substrate, a display panel and a display device. The array substrate comprises a substrate, a transistor and a photosensitive element above the substrate. The transistor comprises a gate and is used for controlling display of pixels. The photosensitive element comprises a light-transmissive electrode and a photosensitive layer, the light-transmissive electrode being used for allowing sensitive light rays reflected by a surface of a fingerprint pressed thereon to pass through and impinge on the photosensitive layer, and the light-transmissive electrode being connected to the gate. By connecting the light-transmissive electrode to the gate, the array substrate achieves synchronization of image display and fingerprint identification without individually providing a scan function for fingerprint identification, which greatly facilitates the actual applications requiring synchronization of image display and fingerprint identification.

20 Claims, 2 Drawing Sheets

(51) Int. Cl.
  *G02F 1/1362* (2006.01)
  *G02F 1/1368* (2006.01)
  *G06K 9/00* (2006.01)

(58) Field of Classification Search
  CPC ........... G02F 1/13338; G02F 1/136227; G02F 1/1368; G06K 9/0004
  See application file for complete search history.

(56) References Cited

U.S. PATENT DOCUMENTS

| | | | |
|---|---|---|---|
| 2005/0157914 A1* | 7/2005 | Kim | G06K 9/0002 382/127 |
| 2006/0011913 A1* | 1/2006 | Yamazaki | G06F 3/0412 257/59 |
| 2008/0074401 A1 | 3/2008 | Chung et al. | |
| 2011/0096035 A1 | 4/2011 | Shen | |
| 2011/0109592 A1* | 5/2011 | Kurokawa | G06F 3/0412 345/175 |
| 2013/0100079 A1 | 4/2013 | Chang et al. | |
| 2013/0249817 A1 | 9/2013 | Jung et al. | |
| 2015/0205156 A1 | 7/2015 | Xu | |
| 2016/0364037 A1 | 12/2016 | Xu et al. | |
| 2017/0124373 A1* | 5/2017 | Liao | G06K 9/0004 |
| 2017/0228580 A1 | 8/2017 | Li et al. | |
| 2017/0249520 A1* | 8/2017 | Lee | G06K 9/00892 |

FOREIGN PATENT DOCUMENTS

| | | |
|---|---|---|
| CN | 104267856 A | 1/2015 |
| CN | 104656290 A | 5/2015 |
| CN | 104808375 A | 7/2015 |
| CN | 104880842 A | 9/2015 |
| CN | 105095883 A | 11/2015 |
| CN | 105807521 A | 7/2016 |
| JP | 2008-083675 A | 4/2008 |

OTHER PUBLICATIONS

International Search Report and Written Opinion in PCT/CN2017/073912 dated Jun. 2, 2017, with English translation.

* cited by examiner

ARRAY SUBSTRATE, DISPLAY PANEL AND DISPLAY DEVICE CAPABLE OF SYNCHRONIZING IMAGE DISPLAY AND FINGERPRINT IDENTIFICATION

CROSS REFERENCE TO RELATED APPLICATIONS

The present application is the U.S. national phase entry of PCT/CN2017/073912, with an international filing date of Feb. 17, 2017, which claims the benefit of priority from the patent application No. 201610349471.2 filed to the Chinese Patent Office on May 24, 2016, the disclosure of which is incorporated herein by reference.

TECHNICAL FIELD

The present disclosure relates to the field of display technologies, and in particular to an array substrate, a display panel and a display device.

BACKGROUND

In the late 1990s, the Hong Kong Polytechnic University and Tsinghua University took the lead in the pioneering research of fingerprint identification technology. Fingerprint identification has advantages such as high accuracy, fast speed, low price and high user acceptability, so it has attracted full academic attention since it was pioneered. Universities and research institutions both domestic and abroad have joined in this research field and made a series of achievements.

At present, fingerprint identification functions are incorporated into more and more display products. The structure of such a display product is usually implemented by adding a control transistor and a photosensitive element (such as a photoresistance or photosensitive diode) to a display pixel. That is, the control transistor controls the photosensitivity of the photosensitive element to achieve identification of fingerprints.

However, according to an existing control scheme for the photosensitive element, the control transistor is usually controlled individually. For example, scan lines for the control transistor are arranged separately and the control transistor is controlled individually by scanning. Meanwhile, transistors and scan lines used for displaying function in the display product are arranged separately for controlling normal display of pixels in the display product.

However, with such design of fingerprint identification, image display and fingerprint identification cannot be carried out synchronously. In other words, a fingerprint cannot be identified when a display image is viewed, and a special scan time for fingerprint identification is required. In actual applications such as fingerprint unlocking and fingerprint identification payment in which a screen or a payment interface is triggered by fingerprints, the fingerprint identification functions cannot be achieved with the image displayed normally, which leads to great inconvenience in the actual applications.

SUMMARY

In light of the above problems existing in the prior art, this disclosure provides an array substrate, a display panel and a display device.

The array substrate provided according to the embodiments of the present disclosure comprises a substrate, a transistor and a photosensitive element above the substrate, the transistor comprising a gate and being used for controlling display of pixels, and the photosensitive element comprising a light-transmissive electrode and a photosensitive layer. The light-transmissive electrode is used for allowing sensitive light rays reflected by a surface of a fingerprint pressed thereon to pass through and impinge on the photosensitive layer, and the light-transmissive electrode is connected to the gate.

In some embodiments, the photosensitive element further comprises a signal output electrode, which is used for outputting an electric signal based on the sensitive light rays impinging on the photosensitive layer so as to identify the fingerprint. The photosensitive layer is located between the light-transmissive electrode and the signal output electrode.

In some embodiments, the photosensitive element is arranged in a direction of an orthogonal projection of the transistor onto the substrate, and the photosensitive element is located at a side of the transistor away from the substrate.

In some embodiments, the signal output electrode, the photosensitive layer and the light-transmissive electrode are sequentially far away from the transistor.

In some embodiments, the transistor further comprises a source and a drain, the source and the drain being in a same layer and spaced from each other, the photosensitive element overlaps a spacing region between the source and the drain, wherein the signal output electrode is made of a same material as the gate.

In some embodiments, the gate completely occludes the photosensitive element in a direction of an orthogonal projection of the gate onto the substrate.

In some embodiments, the array substrate further comprises a transparent electrode above the source and the drain, the light-transmissive electrode and the transparent electrode being made of a same material and in a same layer, wherein a material for the photosensitive layer comprises at least one selected from the group consisting of lead sulfide, amorphous silicon and polysilicon material.

In some embodiments, the array substrate further comprises a pixel electrode connected with the drain, the transparent electrode being a common electrode, wherein a passivation layer is arranged between the pixel electrode and the transparent electrode.

Another embodiment of the disclosure provides a display panel comprising the array substrate according to any of the above embodiments.

In some embodiments, the display panel further comprises a color film substrate and a backlight source, the color film substrate being aligned with the array substrate, the backlight source being arranged at a side of the array substrate away from the color film substrate and configured for providing backlight to the array substrate and the color film substrate which are aligned. The backlight source comprises a sensitive light source for emitting the sensitive light rays. The color film substrate comprises a black matrix, the black matrix occluding a region in which the transistor is located, and a region of the black matrix corresponding to the photosensitive element allowing transmission of the sensitive light rays.

In some embodiments, the region of the black matrix corresponding to the photosensitive element is made of a material that only allows transmission of the sensitive light rays.

In some embodiments, the region of the black matrix corresponding to the photosensitive element comprises a filter that only allows transmission of the sensitive light rays.

In some embodiments, the backlight source further comprises a display light source for providing backlight for display.

In some embodiments, the sensitive light source comprises an infrared light source.

A further embodiment of the disclosure provides a display device comprising a display panel according to any of the above embodiments.

DETAILED DESCRIPTION OF EMBODIMENTS

In order to enable the skilled in the art to better understand the technical solutions of the embodiments of the present disclosure, the array substrate, the display panel and the display device provided in the embodiments of the present disclosure will be further described below in detail with reference to drawings and examples.

The following reference signs may be used in the description below:

1. substrate; 2. transistor; 21. gate; 22. source; 23. drain; 24. spacing region; 25. active layer; 26 gate insulating layer; 3. photosensitive element; 31. light-transmissive electrode; 32. signal output electrode; 33. photosensitive layer; 4. common electrode; 5. pixel electrode; 6. passivation layer; 100. array substrate; 101. color film substrate; 7. sensitive light ray; 8. black matrix; 9. fingerprint.

Figure 1:
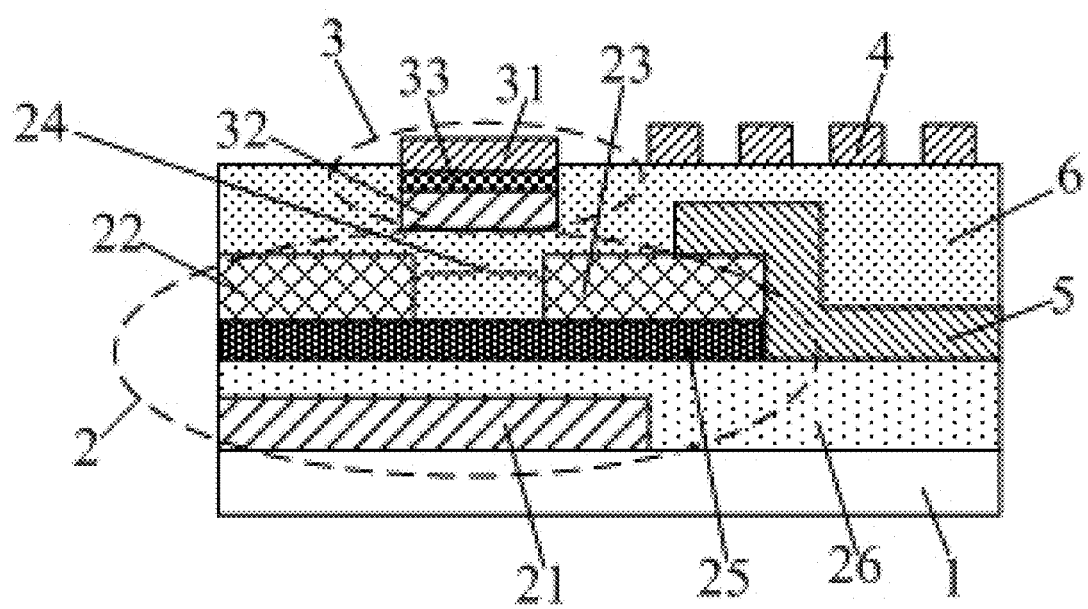
FIG. 1 is a structural section view of an array substrate in an embodiment of the present disclosure.

An embodiment of the present disclosure provides an array substrate as shown in FIG. 1, comprising a substrate 1, a transistor 2 and a photosensitive element 3 on the substrate 1. The transistor 2 comprises a gate 21 and is used for controlling display of pixels. The photosensitive element 3 comprises a light-transmissive electrode 31, a signal output electrode 32 and a photosensitive layer 33 between the light-transmissive electrode 31 and the signal output electrode 32. The light-transmissive electrode 31 is used for allowing sensitive light rays reflected by a surface of a fingerprint pressed thereon to pass through and impinge on the photosensitive layer 33. The signal output electrode 32 is used for outputting an electric signal based on the sensitive light rays impinging on the photosensitive layer 33 so as to identify the fingerprint. The light-transmissive electrode 31 is connected to the gate 21.

The sensitive light rays mentioned herein refer to light rays received and sensed by the photosensitive element 3 for identification of the fingerprint. In an embodiment, the sensitive light rays are infrared light rays. Of course, the sensitive light rays can also be other light rays that can be used by the photosensitive element 3 for identification of the fingerprint.

By connecting the light-transmissive electrode 31 to the gate 21, when the transistor 2 is switched on upon input of a scan signal to the gate 21, corresponding pixels in the array substrate controlled by the transistor 2 are driven to perform displaying, and meanwhile the photosensitive element 3 corresponding to the light-transmissive electrode 31 is also switched on. The photosensitive layer 33 will have different photoresistance values depending on the amount of sensitive light rays reflected by the surface of the fingerprint that are received (the fingerprint comprises both ridges and valleys, the ridges and the valleys reflect different amounts of sensitive light rays that impinge thereon). Since the voltage difference between the light-transmissive electrode 31 and the signal output electrode 32 is basically unchanged, the difference in the photoresistance values will cause a difference in the magnitude of a current outputted by the signal output electrode 32, from which the fingerprint can be identified. As a result, functions of image display and fingerprint identification can be achieved simultaneously, without individually requiring a fingerprint identification scan time for the array substrate, which greatly facilitates the actual applications requiring synchronization of display and fingerprint identification.

In this embodiment, the photosensitive element 3 is arranged in the direction of an orthogonal projection of the transistor 2 onto the substrate 1, and is located at a side of the transistor 2 away from the substrate 1. With such arrangement, on one hand, the photosensitive element 3 will not occupy a region where the pixels are located, which ensures that the array substrate can normally perform display function; on the other hand, due to the fact that the photosensitive element 3 is located at a side of the transistor 2 away from the substrate 1, it is advantageous for the photosensitive element 3 to receive the sensitive light rays reflected by the surface of the fingerprint pressed thereon, thereby enabling identification of the fingerprint.

In this embodiment, the signal output electrode 32, the photosensitive layer 33 and the light-transmissive electrode 31 are sequentially arranged far away from the transistor 2.

The transistor 2 further comprises a source 22 and a drain 23, the source 22 and the drain 23 being arranged in a same layer and spaced from each other, the photosensitive element 3 overlaps a spacing region 24 between the source 22 and the drain 23. The signal output electrode 32 is made of a same material as the gate 21. In this way, the photosensitive element 3 can shade a channel region of the transistor 2 when the latter is switched on, thereby avoiding an increase in a drain current of the transistor due to irradiation to the channel region of the transistor by the sensitive light rays for fingerprint identification, and in turn ensuring a normal display.

It should be noted that in other embodiments, the source 22 and the drain 23 can be arranged in different layers.

In the embodiment as shown in FIG. 1, the gate 21 completely occludes the photosensitive element 3 in the direction of an orthogonal projection of the gate 21 onto the substrate 1. With such arrangement, the photosensitive element 3 can only receive the sensitive light rays reflected by the surface of the fingerprint pressed thereon, but not sensitive light rays other than those reflected by the surface of the fingerprint (for example, sensitive light rays coming from beneath the photosensitive element 3), which can prevent the identification of the fingerprint by the photosensitive element 3 from being interfered by other sensitive light rays (i.e., those not reflected by the surface of the fingerprint), and thus make the identification of the fingerprint by the photosensitive element 3 more accurate.

In an embodiment, the array substrate further comprises a transparent electrode above the source 22 and the drain 23, and the light-transmissive electrode 31 and the transparent electrode can be made of a same material and arranged in a same layer. The photosensitive layer 33 may be made of lead sulfide, amorphous silicon or polysilicon materials. The materials for the photosensitive layer 33 are photosensitive materials, and when the photosensitive materials are irradiated by sensitive light rays, their resistance values will vary with an irradiation amount of the sensitive light rays.

In the embodiment as shown in FIG. 1, the transparent element is a common electrode 4. Besides, a pixel electrode 5 is further arranged above the source 22 and the drain 23. The pixel electrode 5 is connected with the drain 23, and a passivation layer 6 is arranged above the transparent electrode 5. The common electrode 4 is arranged on the passivation layer 6. The transistor 2 further comprises an active layer 25, and a gate insulating layer 26 is further arranged between the gate 21 and the active layer 25. In such an embodiment, the liquid crystal display panel comprising the array substrate is in a high aperture ratio advanced super dimension switch (H-ADS) display mode. The light-transmissive electrode 31 and the common electrode 4 are made of a same material and arranged in a same layer, which can avoid the process for individually manufacturing the light-transmissive electrode 31 and thus save the process cost. The light-transmissive electrode 31 and the common electrode 4 can be made of indium tin oxides which can enable the light-transmissive electrode 31 to easily allow the sensitive light rays reflected by the surface of the fingerprint to pass through and impinge on the photosensitive layer 33.

It should be noted that in other embodiments, the transparent electrode may be a pixel electrode, and a common electrode is arranged above the source and the drain, with a passivation layer arranged above the common electrode, and the pixel electrode is arranged above the passivation layer. That is, in such an embodiment, the liquid crystal display panel comprising the array substrate can be in an advanced super dimension switch (ADS) display mode. The light-transmissive electrode and the pixel electrode can be made of a same material and arranged in a same layer.

In yet another embodiment, the liquid crystal display panel comprising the array substrate can also be in a twisted nematic (TN) display mode. That is, the transparent electrode is a pixel electrode, a passivation layer is arranged above the source and the drain, the pixel electrode is located on the passivation layer, and the pixel electrode and the drain are connected through a via hole penetrating the passivation layer. The light-transmissive electrode and the pixel electrode is made of a same material and arranged in a same layer.

In an embodiment, touch principles of a capacitive touch screen can be used for determining whether a finger is pressed on the array substrate and a pressing position of the finger on the array substrate. That is, the array substrate is integrated with a capacitive touch function, and whether a finger is pressed on the array substrate is firstly determined by means of capacitive touch principles, and meanwhile a specific position where the finger is pressed on the array substrate is determined, and then the fingerprint pressed on the array substrate in a certain position is identified by the photosensitive element 3. The technique of determining whether a finger is pressed and a touching position of the finger by means of capacitive touch principle is quite mature, which will not be detailed herein for simplicity.

For the array substrate provided herein, by connecting the light-transmissive electrode of the photosensitive element to the gate of the transistor, it is allowed to perform image displaying and fingerprint identification at the same time, without specially providing a scan function for fingerprint identification, which greatly facilitates the actual applications requiring synchronization of image display and fingerprint identification.

Figure 2:
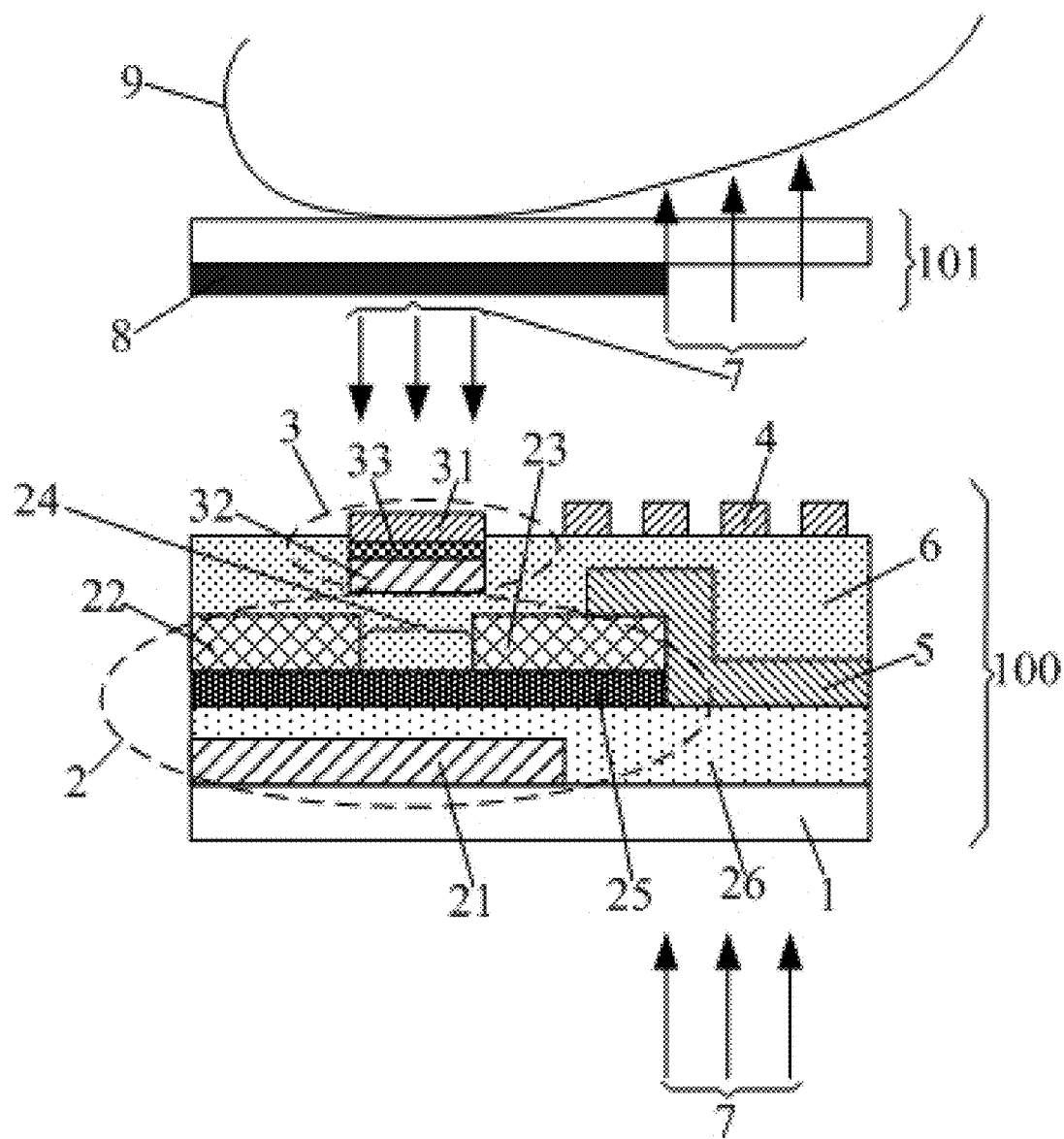
FIG. 2 is a structural section view of a display panel in another embodiment of the present disclosure.

Another embodiment of the present disclosure provides a display panel as shown in FIG. 2, comprising the array substrate 100 provided in the embodiment as shown in FIG. 1.

In this embodiment, the display panel comprises a color film substrate 101 and a backlight source (not shown). The color film substrate 101 can be aligned with the array substrate 100, and the backlight source is arranged at a side of the array substrate 100 away from the color film substrate 101 and configured for providing backlight to the array substrate 100 and the color film substrate 101 which are aligned. The backlight source comprises a sensitive light source for emitting sensitive light rays 7. The color film substrate 101 comprises a black matrix 8, the black matrix 8 correspondingly occludes a region in which the transistor 2 is located, and a region of the black matrix 8 corresponding to the photosensitive element 3 allows transmission of the sensitive light rays 7. When a fingerprint 9 is pressed against the display panel on the side of the color film substrate 101, the sensitive light rays 7 emitted by the sensitive light source onto the fingerprint 9 need to impinge on the photosensitive element 3 through the black matrix after being reflected by the fingerprint 9, so it is required that the region of the black matrix 8 corresponding to the photosensitive element 3 should allow transmission of the sensitive light rays 7.

In some embodiments, the backlight source further comprises a display light source for providing backlight for display. The sensitive light source and the display light source can be arranged in a same position and in a same manner. In this way, the backlight for display and the light rays for fingerprint identification can be provided by the display light source and the sensitive light source in the backlight source respectively, which ensures that image display and fingerprint identification can be carried out simultaneously and normally.

In some embodiments, the sensitive light source comprises an infrared light source. The infrared light source emits infrared light rays. The region of the black matrix 8 corresponding to the photosensitive element 3 is made of a material that can only allow transmission of the sensitive light rays 7. For example, in this embodiment, the region of the black matrix 8 corresponding to the photosensitive element 3 is made of a material that can only allow transmission of infrared light rays, such that the region of the black matrix 8 corresponding to the photosensitive element 3 can only allow transmission of the sensitive light rays 7 for identifying the fingerprint while the backlight for normal display cannot pass through the black matrix, which not only ensures normal display of the display panel, but also achieves the function of fingerprint identification by the display panel. For example, as compared with other regions of the black matrix 8, the region of the black matrix 8 corresponding to the photosensitive element 3 can be free of chromium or contain only a small amount of chromium such that the infrared light rays can pass through while other light rays are mostly blocked.

In a further embodiment, the region of the black matrix 8 corresponding to the photosensitive element 3 may comprise a filter which can only allow transmission of the sensitive light rays 7. That is, the filter is a special filter which only allows transmission of the sensitive light rays 7 while disallows transmission of light rays other than the sensitive light rays 7 (e.g., the backlight for display).

For the display panel provided in the embodiment as shown in FIG. 2, with the array substrate provided in the above embodiments of the present disclosure, it is possible to synchronize image display with fingerprint identification without requiring a special scan function for fingerprint identification, which greatly facilitates the actual applications requiring synchronization of image display and fingerprint identification for the display panel.

Yet another embodiment of the present disclosure provides a display device, comprising the display panel provided in the above embodiments.

With the display panel provided in the embodiment of the present disclosure, it is possible for the display device to synchronize image display with fingerprint identification without individually providing a scan function for fingerprint identification, which is advantageous to the actual applications requiring synchronization of image display and fingerprint identification for the display device.

The display device provided in the embodiments of the present disclosure can be any product or component having a display function, such as a liquid crystal panel, a liquid crystal television, a display, a mobile phone, a navigator and the like.

It can be understood that the embodiments above are only exemplary embodiments for illustrating principles of the invention, but the invention should not be limited thereto. For a person having an ordinary skill in the art, various variations and modifications can be made without departing from the spirit and the essence of the disclosure, and these variations and modifications shall be regarded as falling within the scope of the invention.

The invention claimed is:

1. An array substrate comprising a substrate, a transistor and a photosensitive element above the substrate, the transistor comprising a gate and being used for controlling display of pixels, and the photosensitive element comprising a light-transmissive electrode and a photosensitive layer,
   wherein the light-transmissive electrode is used for allowing sensitive light rays reflected by a surface of a fingerprint pressed thereon to pass through and impinge on the photosensitive layer, and the light-transmissive electrode is connected to the gate.

2. The array substrate according to claim 1, wherein the photosensitive element further comprises a signal output electrode, which is used for outputting an electric signal based on the sensitive light rays impinging on the photosensitive layer so as to identify the fingerprint, wherein the photosensitive layer is located between the light-transmissive electrode and the signal output electrode.

3. The array substrate according to claim 2, wherein the photosensitive element is arranged in a direction of an orthogonal projection of the transistor onto the substrate, and the photosensitive element is located at a side of the transistor away from the substrate.

4. The array substrate according to claim 3, wherein the signal output electrode, the photosensitive layer and the light-transmissive electrode are sequentially far away from the transistor.

5. The array substrate according to claim 4, wherein the transistor further comprises a source and a drain, the source and the drain being in a same layer and spaced from each other, the photosensitive element overlaps a spacing region between the source and the drain, wherein the signal output electrode is made of a same material as the gate.

6. The array substrate according to claim 5, wherein the array substrate further comprises a transparent electrode above the source and the drain, the light-transmissive electrode and the transparent electrode being made of a same material and in a same layer, wherein a material for the photosensitive layer comprises at least one selected from the group consisting of lead sulfide, amorphous silicon and polysilicon material.

7. The array substrate according to claim 6, wherein the array substrate further comprises a pixel electrode connected with the drain, the transparent electrode being a common electrode, wherein a passivation layer is arranged between the pixel electrode and the transparent electrode.

8. The array substrate according to claim 1, wherein the gate completely occludes the photosensitive element in a direction of an orthogonal projection of the gate onto the substrate.

9. A display panel comprising the array substrate according to claim 1.

10. The display panel according to claim 9, further comprising a color film substrate and a backlight source, the color film substrate being aligned with the array substrate, the backlight source being arranged at a side of the array substrate away from the color film substrate and configured for providing backlight to the array substrate and the color film substrate which are aligned,
   wherein the backlight source comprises a sensitive light source for emitting the sensitive light rays,
   wherein the color film substrate comprises a black matrix, the black matrix occluding a region in which the transistor is located, and a region of the black matrix corresponding to the photosensitive element allowing transmission of the sensitive light rays.

11. The display panel according to claim 10, wherein the region of the black matrix corresponding to the photosensitive element is made of a material that only allows transmission of the sensitive light rays.

12. The display panel according to claim 10, wherein the region of the black matrix corresponding to the photosensitive element comprises a filter that only allows transmission of the sensitive light rays.

13. The display panel according to claim 10, wherein the backlight source further comprises a display light source for providing backlight for display.

14. The display panel according to claim 13, wherein the sensitive light source comprises an infrared light source.

15. A display device comprising a display panel according to claim 9.

16. The display panel according to claim 9, wherein the photosensitive element further comprises a signal output electrode, which is used for outputting an electric signal based on the sensitive light rays impinging on the photosensitive layer so as to identify the fingerprint, wherein the photosensitive layer is located between the light-transmissive electrode and the signal output electrode.

17. The display panel according to claim 16, wherein the photosensitive element is arranged in a direction of an orthogonal projection of the transistor onto the substrate, and the photosensitive element is located at a side of the transistor away from the substrate.

18. The display panel according to claim 17, wherein the signal output electrode, the photosensitive layer and the light-transmissive electrode are sequentially far away from the transistor.

19. The display panel according to claim 18, wherein the transistor further comprises a source and a drain, the source and the drain being in a same layer and spaced from each other, the photosensitive element overlaps a spacing region between the source and the drain, wherein the signal output electrode is made of a same material as the gate.

20. The display panel according to claim 9, wherein the gate completely occludes the photosensitive element in a direction of an orthogonal projection of the gate onto the substrate.

* * * * *